(12) United States Patent
Ramsbey et al.

(10) Patent No.: US 6,433,383 B1
(45) Date of Patent: Aug. 13, 2002

(54) METHODS AND ARRANGEMENTS FOR FORMING A SINGLE INTERPOLY DIELECTRIC LAYER IN A SEMICONDUCTOR DEVICE

(75) Inventors: Mark Ramsbey, Sunnyvale; Unsoon Kim, Santa Clara; Kenneth Wo-Wai Au, Fremont; David H. Chi, Sunnyvale; James Markarian, Los Altos, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/357,333

(22) Filed: Jul. 20, 1999

(51) Int. Cl.[7] .................. H01L 27/108; H01L 29/76
(52) U.S. Cl. .................. 257/315; 257/314; 257/411
(58) Field of Search .................. 438/287, 37, 775, 438/769, 427, 538, 791, 786; 257/324, 411, 636, 639, 649, 750, 314, 315, 316, 760, 325; 439/778

(56) References Cited

U.S. PATENT DOCUMENTS

| | | | | |
|---|---|---|---|---|
| 5,407,870 A | * | 4/1995 | Okada et al. ............... 437/241 |
| 5,500,816 A | * | 3/1996 | Kobayashi .................. 365/185 |
| 5,619,052 A | * | 4/1997 | Chang et al. ............... 257/321 |
| 5,780,891 A | * | 7/1998 | Kauffman et al. .......... 257/316 |
| 5,814,853 A | * | 9/1998 | Chen .......................... 257/315 |
| 5,926,741 A | * | 7/1999 | Matsuoka et al. .......... 438/778 |
| 5,939,763 A | * | 8/1999 | Hoa et al. ................... 257/411 |
| 5,972,804 A | * | 10/1999 | Tobin et al. ................ 438/786 |
| 6,107,174 A | * | 8/2000 | Hori ........................... 438/585 |
| 6,184,088 B1 | * | 2/2001 | Kurooka et al. ............ 438/264 |

* cited by examiner

*Primary Examiner*—Tom Thomas
*Assistant Examiner*—Ori Nadav

(57) ABSTRACT

A single interpoly dielectric layer is provided for use in semiconductor devices. The single interpoly dielectric layer being formed of silicon graded such that certain regions within the single interpoly dielectric layer are either oxygen-rich or nitrogen-rich. The single interpoly dielectric layer can be formed in-situ within a single deposition tool. In certain embodiments, the resulting single interpoly dielectric layer can be made thinner and/or can be formed to provide improved dielectric characteristics when compared to a conventional oxide-nitride-oxide (ONO) interpoly dielectric layer that has three separate and unique layers. Thus, the single interpoly dielectric layer is highly desirable for use in reduced-size semiconductor devices and/or semiconductor devices requiring improved data retention capabilities, such as non-volatile memory cells.

4 Claims, 4 Drawing Sheets

METHODS AND ARRANGEMENTS FOR FORMING A SINGLE INTERPOLY DIELECTRIC LAYER IN A SEMICONDUCTOR DEVICE

FIELD OF THE INVENTION

The present invention relates to semiconductor devices and manufacturing processes, and more particularly to methods and arrangements for providing a dielectric layer for use within a non-volatile memory semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28 that acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that is deposited over the exposed portions of substrate 12, tunnel oxide 15, and field oxides 14a–b. Interpoly dielectric layer 24 has been conformally deposited over the exposed portions of floating gates 16a–c and field oxides 14a–b. Interpoly dielectric layer 24 isolates floating gates 16a–c from the next conformal layer, which is typically a polysilicon layer that is patterned (e.g., along the bit line) to form control gate 26. Interpoly dielectric layer 24 typically includes a plurality of separately formed layers or films, such as, for example, a bottom film of silicon dioxide, a middle film of silicon nitride, and a top film of silicon dioxide. This type of interpoly dielectric layer is commonly referred to as an oxide-nitride-oxide (ONO) layer. The thickness and physical properties of interpoly dielectric layer 24 affect the data retention capabilities of memory cell 8.

The continued shrinking of the memory cells, and in particular the basic features depicted in the memory cells of FIGS. 1a–b, places a burden on the fabrication process to deposit and subsequently pattern a layer stack to form a floating gate/control gate structure, without creating deleterious effects within the resulting memory cells. Of particular concern is the need to control the formation of the interpoly dielectric layer, which tends to be significantly thin in reduced-size semiconductor devices. The conventional fabrication processes associated with the multiple films associated with a typical ONO interpoly dielectric layer can be difficult to control, and/or often require additional processes which can lead to further difficulties in sub-quarter micron sized semiconductor devices. Thus, there is a need for improved interpoly dielectric layer arrangements, and more efficient methods for fabricating the same.

SUMMARY OF THE INVENTION

These needs and others are met by the present invention, which provides a single dielectric layer and methods for making the same. In accordance with certain aspects of the present invention, the single dielectric layer arrangement, which is continuous and free of internal interfaces, can be significantly thinner than a conventional ONO dielectric layer, while providing adequate isolation between the floating and control gates structures and/or increased data retention capabilities. Thus, the single dielectric layer and methods can be advantageously employed during the manufacturing of various reduced-size semiconductor devices.

In accordance with certain embodiments of the present invention, a semiconductor device having a single continuous dielectric layer is provided. The single continuous dielectric layer, which is free of internal interfaces, includes silicon and has a first oxygen-rich region, a nitrogen-rich region, and a second oxygen-rich region. The nitrogen-rich region is located between the first and second oxygen-rich regions. In certain embodiments, the single continuous dielectric layer is positioned between a floating gate structure and a control gate structure within a semiconductor device. For example, in certain embodiments the first oxygen-rich region is in direct physical contact with at least a portion of the floating gate structure and the second oxygen-rich region is in direct physical contact with at least a portion of the control gate structure. In accordance with other embodiments of the present invention, the percentage of nitrogen and/or oxygen within the single continuous dielectric layer varies within the; first oxygen-rich region, nitrogen-rich region and second oxygen-rich region. For example, the percentage of nitrogen and/or oxygen within the single continuous dielectric layer can be graded as a function of the thickness of the single continuous dielectric layer.

The above stated and needs and other are also met by a method for forming a single continuous dielectric layer in a semiconductor device in accordance with certain embodiments of the present invention. The method includes forming a first oxygen-rich region, forming a nitrogen-rich region, and forming a second oxygen-rich region. The nitrogen-rich region is located between the first and second oxygen-rich regions. The first oxygen-rich region, nitrogen-rich region and second oxygen-rich region are formed in-situ, which results in a single continuous dielectric layer free of internal interfaces. In certain embodiments, the method includes using at least dichlorosilane (DCS) and $N_2O$ gases to form the first oxygen-rich region 32, at least dichlorosilane and $NH_3$ gases to form the nitrogen-rich region 34, and at least dichlorosilane and $N_2O$ gases to form the second oxygen-rich region 36. The method, in certain embodiments is advantageously conducted in-situ using deposition techniques, such as, for example thermal deposition techniques, chemical vapor deposition (CVD) techniques, plasma enhanced chemical vapor deposition (PECVD) techniques, or the like.

In accordance with other certain other embodiments, a method is provided for manufacturing a semiconductor device. The method includes forming a first gate structure over a substrate, forming, in-situ, a single interfaceless dielectric layer over the first gate structure, and forming a second gate structure over the single interfaceless dielectric layer.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1A:
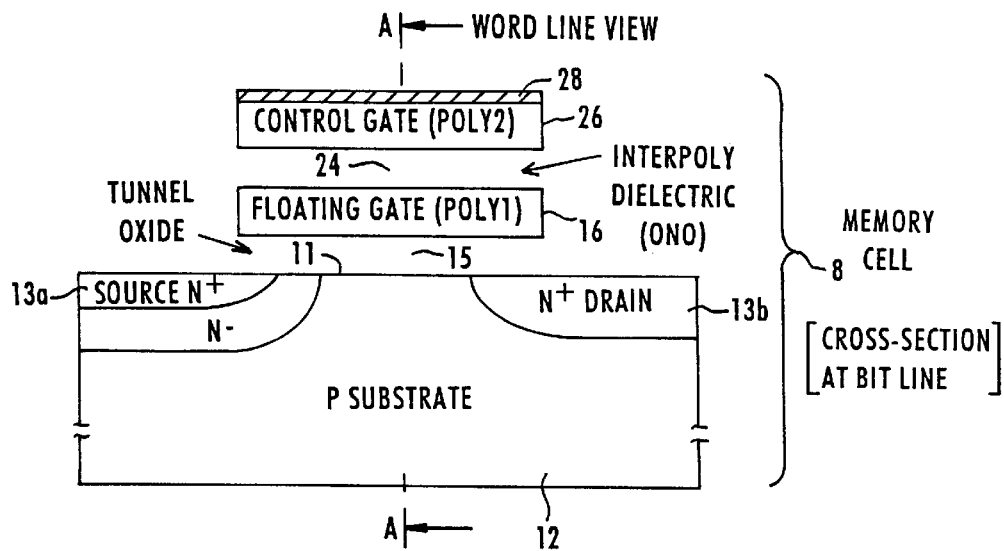
FIG. 1a depicts a cross-sectional view of a portion of a typical prior art semiconductor device having at least one memory cell, as viewed at the bit-line.
Figure 1B:
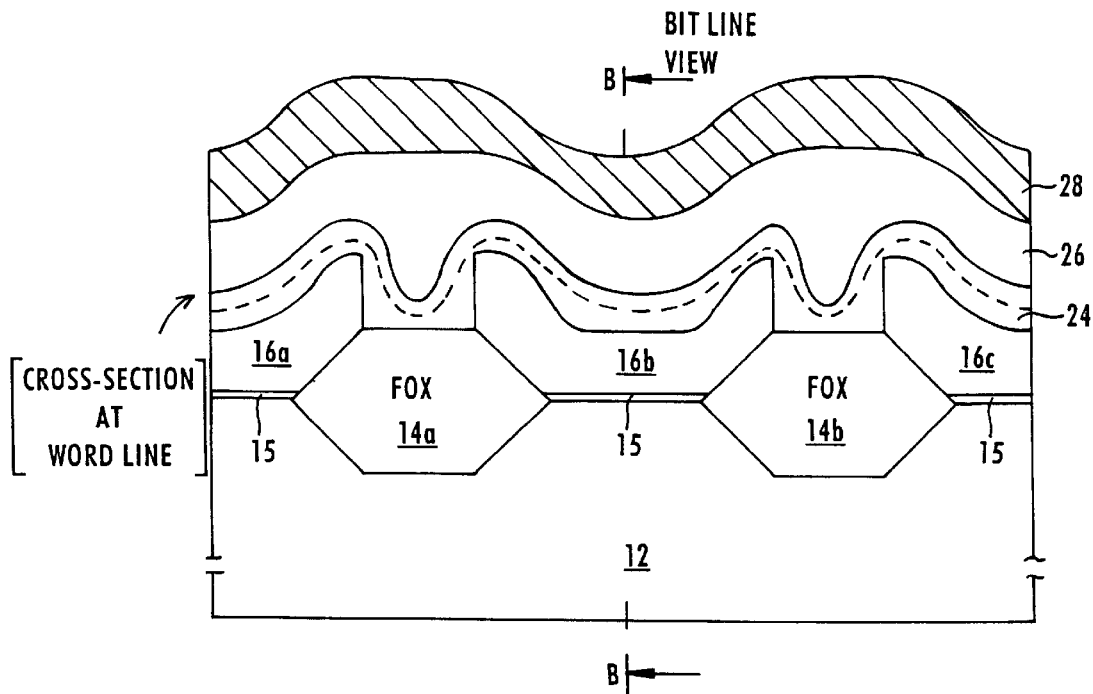
FIG. 1b depicts a cross-sectional view of a portion of a typical prior art semiconductor device, as in FIG. 1, having at least one memory cell, as viewed at the word-line.
Figure 2A:
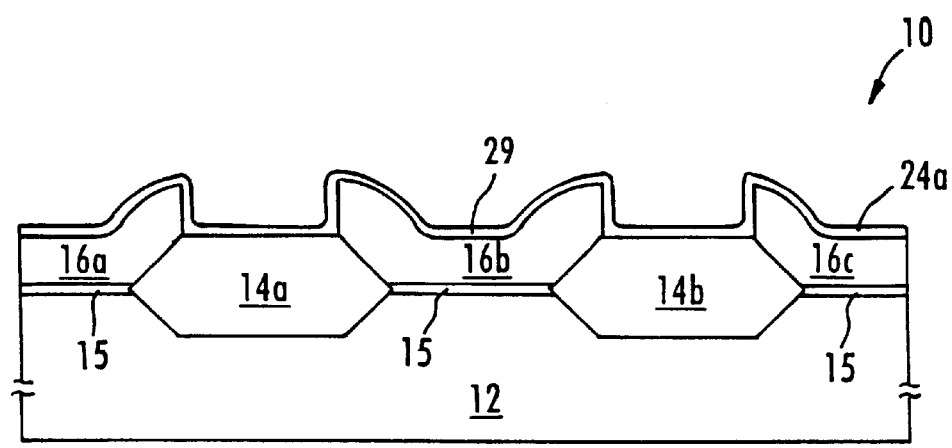
FIG. 2a depicts a cross-sectional view of a portion of a typical prior art semiconductor device, as in FIG. 1a–b, following deposition of a first silicon dioxide film over a plurality of patterned floating gates.

FIG. 2a depicts an exemplary cross-sectional view of a portion 10 of a typical prior art semiconductor, similar to FIG. 1a–b, following the formation of floating gates 16a–c. By way of example, floating gates 16a–c are typically formed by depositing a conformal layer of doped polysilicon over the exposed surfaces of the field oxides 14a–b and tunnel oxide 15 regions of the semiconductor wafer. The layer of doped polysilicon is typically formed using conventional chemical vapor deposition (CVD) or plasma enhanced chemical vapor deposition (PECVD) techniques, or the like. Next, the layer of doped polysilicon is selectively etched to electrically isolate a plurality of floating gates, such as floating gates 16a–c. The selective etching process exposes portions of the top surface of field oxide 14a between floating gates 16a and 16b, and field oxide 14b between floating gates 16b and 16c. The selective etching process typically includes forming a resist mask (not shown) on the layer of doped polysilicon and etching away exposed portions of the doped polysilicon layer and stopping on the underlying field oxide regions.

Figure 2B:
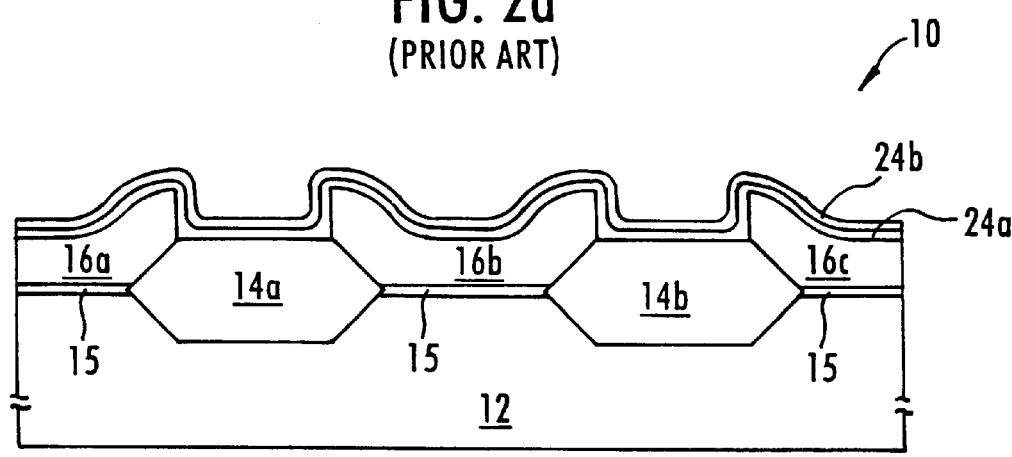
FIG. 2b depicts a cross-sectional view of the portion of FIG. 2a following deposition of a silicon nitride film on the first silicon dioxide film.
Figure 2C:
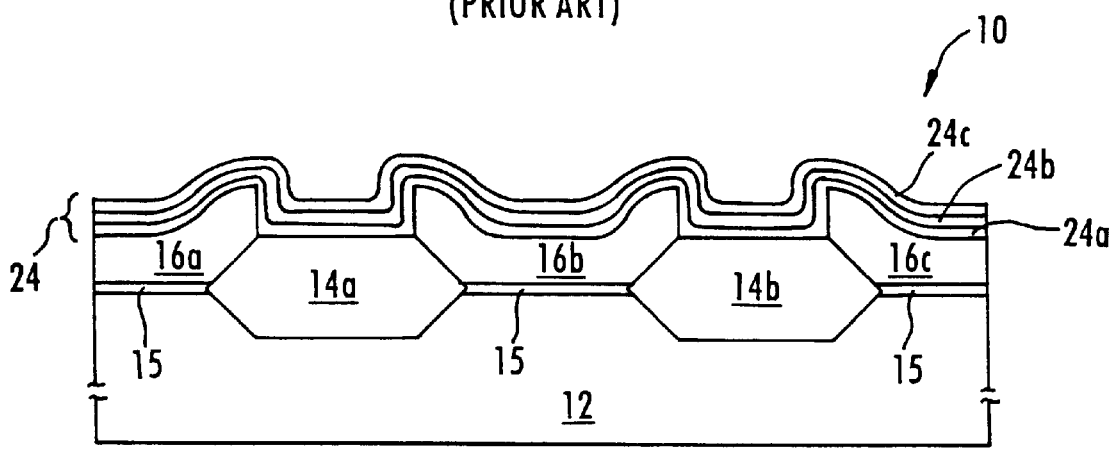
FIG. 2c depicts a cross-sectional view of the portion of FIG. 2b following deposition of a second silicon dioxide film on the silicon nitride film, which completes the formation of a conformal interpoly dielectric layer that includes the first silicon dioxide film, the silicon nitride film and the second silicon dioxide film.

Next, as sequentially depicted in FIGS. 2a–c, a conventional interpoly dielectric layer 24 is then formed over the floating gates 16a–c and field oxides 14a–b, by separately depositing a plurality of dielectric layers or films (e.g., films 24a–c). In this exemplary embodiment, interpoly dielectric layer 24 is an ONO layer that includes a first silicon dioxide film 24a formed on floating gates 16a–c and field oxides 14a–b (as shown in FIG. 2a), a silicon nitride film 24b formed on first silicon dioxide film 24a (as shown in FIG. 2b), and a second silicon dioxide film 24c formed on silicon nitride film 24b (as shown in FIG. 2c). Films 24a–c are typically formed using conventional thermal, CVD, and/or PECVD deposition techniques. By way of example, in one prior art embodiment the first silicon dioxide film 24a is about 50 Angstroms thick and formed using conventional thermal oxide deposition techniques, the silicon nitride film 24b is about 80 Angstroms thick and formed using conventional CVD or PECVD techniques, and the second silicon dioxide layer 24c is about 40 Angstroms thick and formed using conventional CVD or PECVD techniques.

Since each of the above described deposition processes typically requires the use of a different tool, there is a need to move the semiconductor wafer between these tools. For example, a conventional oxide furnace (not shown) is typically used to thermally grow the first silicon dioxide film 24a. The proper formation of the first silicon dioxide layer 24a is critical to the effectiveness of the interpoly dielectric layer 24. As such, the furnace provides a controllable environment in which the growth of the first silicon dioxide film 24a can be carefully controlled to promote uniformity and step coverage of the first silicon dioxide film 24a. After the first silicon dioxide film 24a has been formed, the semiconductor wafer is moved to a first CVD or PECVD tool (not shown) wherein the silicon nitride film 24b is deposited. Next, the semiconductor wafer is typically moved once again to a second CVD or PECVD tool (not shown) that is dedicated for use in depositing silicon dioxide. Here, the second silicon dioxide film 24c is deposited. Thus, in this exemplary embodiment, the formation of interpoly dielectric layer 24 not only requires the use of many resources (e.g., several tools), but it is also a significantly labor intensive process.

Figure 3:
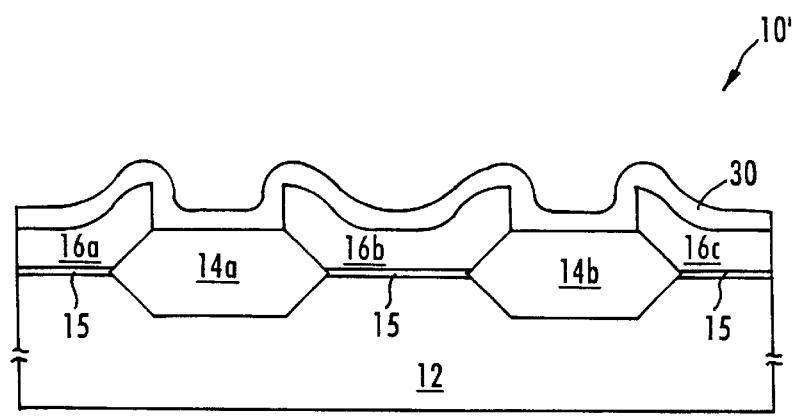
FIG. 3 depicts a cross-sectional view of a portion of a semiconductor device having a single interpoly dielectric layer formed over a plurality floating gates, in accordance with certain embodiments of the present invention.

In accordance with certain embodiments of the present invention, methods and arrangements are provided for a single layer that effectively replaces the traditional ONO interpoly dielectric layer, such as interpoly dielectric layer 24. This single layer is referred to, hereinafter, as a graded interpoly dielectric layer 30 (see portion 10' of FIG. 3), because it is preferably formed in-situ within one deposition tool and includes silicon having at least one distinct region wherein there is an increased oxygen content and at least one region wherein there is an increased nitrogen content. Consequently, in accordance with certain embodiments of the present invention, there is essentially a graded increase and/or decrease in either the amount of oxygen and/or nitrogen content within the silicon layer.

In accordance with certain exemplary embodiments of the present invention, the graded interpoly dielectric layer 30 effectively includes a first oxygen-rich region 32, a nitrogen-rich region 34 and a second oxygen-rich region 36. These exemplary regions of graded interpoly dielectric layer 30 are sequentially formed, for example, as depicted in the enlarged views of portion 10' in FIGS. 4a–c, within a single conventional deposition tool (not shown), such as, for example, a furnace, CVD tool, PECVD tool, or the like. Therefore, graded interpoly dielectric layer 30 can be formed with fewer resources and without relocating the semiconductor wafer. This advantageously increases throughput during manufacturing and reduces manufacturing costs.

It has been found in certain embodiments of the present invention, that graded interpoly dielectric layer 30 can be made thinner than a comparable conventional ONO interpoly dielectric layer 24 due to an improvement in fabrication control and/or increases in the dielectric properties of the resulting layer. This is especially important in reduced-size semiconductor devices, such as, for example, sub-quarter micron (i.e., less than 0.25 microns) devices, that benefit from and/or require thinner layers.

For memory cell 8 and other like devices, the increased dielectric properties associated with certain embodiments of the graded interpoly dielectric layer 30 provide a significant increase in the data retention capability (e.g., electron retention capability) when compared to a conventional ONO interpoly dielectric layer 24 having about the same thickness. This allows for improved memory cells.

With these exemplary benefits in mind, several methods and arrangements in accordance with certain embodiments of the present invention are described in more detail below.

Figures 4A, 4B, 4C:
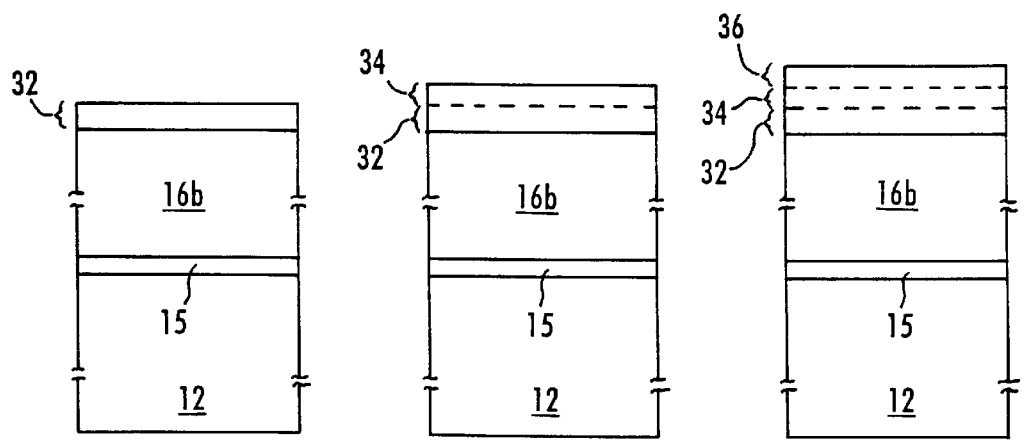
FIG. 4a depicts an enlarged view of the portion of FIG. 3 following the formation of a first oxygen-rich region of the single interpoly dielectric layer on a floating gate, in accordance with certain embodiments of the present invention.
FIG. 4b depicts the portion of FIG. 4a following the formation of a nitrogen-rich region of the single interpoly dielectric layer, in accordance with certain embodiments of the present invention.
FIG. 4c depicts the portion of FIG. 4b following the formation of a second oxygen-rich region of the single interpoly dielectric layer to complete the formation of the single interpoly dielectric layer, in accordance with certain embodiments of the present invention.

FIGS. 4a–c depict the sequential formation of an exemplary graded interpoly dielectric layer 30, as represented at three stages during the formation process. The first stage of the exemplary formation process is depicted in FIG. 4a, wherein the first oxygen-rich region 32 of graded interpoly dielectric layer 30 is formed on the top surface of floating gate 16b. First oxygen-rich region 32 includes silicon substantially in the form of silicon dioxide and/or silicon oxynitride. Thus, for example, in accordance with certain embodiments of the present invention, first oxygen-rich region 32 uniformly consists substantially of silicon dioxide, while in accordance with still other embodiments of the present invention, first oxygen-rich region 32 can also include nitrogen. When present, the percentage of nitrogen within first oxygen-rich region 32 near the top surface of floating gate 16b is, however, preferably significantly less than the percentage of oxygen near the top surface of floating gate 16b. In accordance with certain exemplary embodiments of the present invention, first oxygen-rich region 32 is preferably significantly thin, for example, between about 1 Angstrom and about 50 Angstroms thick.

The second stage of the exemplary formation process is depicted in FIG. 4b, wherein nitrogen-rich region 34 of graded interpoly dielectric layer 30 is formed. Nitrogen-rich region 34 includes silicon substantially in the form of silicon nitride and/or silicon oxynitride. Thus, for example, in accordance with certain embodiments of the present invention, nitrogen-rich region 34 uniformly consists substantially of silicon nitride, while in accordance with still other embodiments of the present invention, nitrogen-rich region 34 can also include oxygen. In these exemplary embodiments, the average percentage of nitrogen in nitrogen-rich region 34 is preferably significantly greater than the average percentage of oxygen, when present. In accordance with certain exemplary embodiments of the present invention, nitrogen-rich region 34 is also preferably significantly thin, for example, between about 10 Angstroms and about 100 Angstroms thick.

The third stage of the exemplary formation process is depicted in FIG. 4c, wherein the second oxygen-rich region 36 of graded interpoly dielectric layer 30 is formed. Second oxygen-rich region 36 again includes silicon substantially in the form of silicon dioxide and/or silicon oxynitride. In accordance with certain embodiments of the present invention, second oxygen-rich region 36 uniformly consists substantially of silicon dioxide and/or silicon oxynitride. As with the first oxygen-rich region 32, in accordance with still other embodiments of the present invention, oxygen-rich region 36 can also include nitrogen. When present, the percentage of nitrogen in second oxygen-rich region 36 near the top surface of graded interpoly dielectric layer 30 is, however, preferably significantly less than the percentage of oxygen. In accordance with certain exemplary embodiments of the present invention, second oxygen-rich region 36 is again preferably significantly thin, for example, between about 1 Angstrom and about 80 Angstroms thick.

Figure 5:
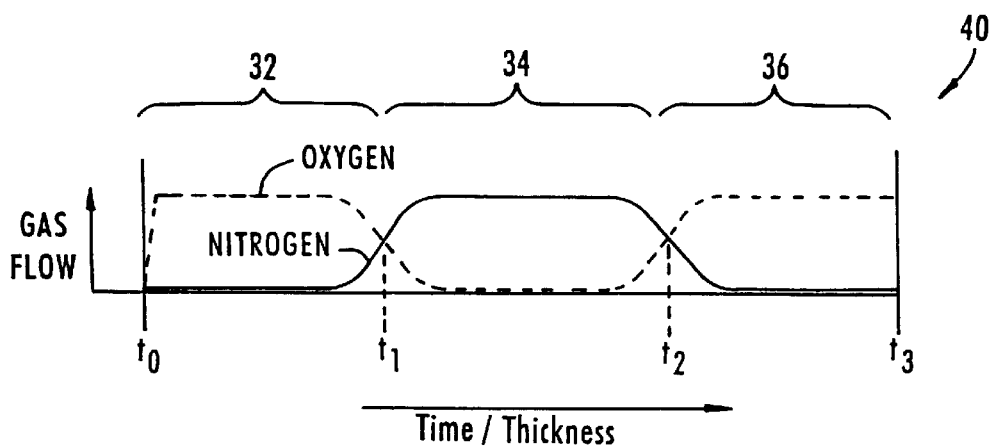
FIG. 5 is a graph that depicts the amount of oxygen and nitrogen gas flow employed during the formation of the single interpoly dielectric layer, for example, as depicted in FIGS. 3 and 4a–c, in accordance with certain embodiments of the present invention, wherein the flow of oxygen is gradually decreased as the flow of nitrogen is gradually increased, and vice versa, as a function of time.

FIG. 5 is a graph that depicts an exemplary process 40 wherein the levels of oxygen and nitrogen source gases are selectively adjusted or otherwise controlled during the formation of graded interpoly dielectric layer 30, for example, as depicted in FIGS. 3 and 4a–c, in accordance with certain embodiments of the present invention. As shown, the flow rate of oxygen source gas, for example $O_2$ gas, to the deposition process (i.e., as selectively supplied to the deposition tool) begins at a first level at or about time $t_0$, when the deposition process begins. The flow rate of oxygen source gas is then continued at about the first level during the formation of first oxygen-rich region 32. At or about time $t_1$, the flow rate of oxygen source gas is gradually reduced and the flow rate of nitrogen source gas (e.g., $NH_3$), which had been significantly less, if not completely shut-off, is gradually increased to a higher second level. Between about time $t_1$ and about time $t_2$ there is significantly more nitrogen source gas than oxygen source gas, which may be completely shut-off. Nitrogen-rich region 34 is formed between about time $t_1$ and about time $t_2$. At or about time $t_2$, the flow rate of nitrogen source gas is gradually reduced to about the level between time $t_0$ and time $t_1$ and the flow rate of oxygen source gas is gradually increased back to about the first level. Thus, between about time $t_2$ and about time $t_3$ there is significantly more oxygen source gas than nitrogen source gas, which may be completely shut-off. Second oxygen-rich region 36 is formed between about time $t_2$ and about time $t_3$.

Figure 6:
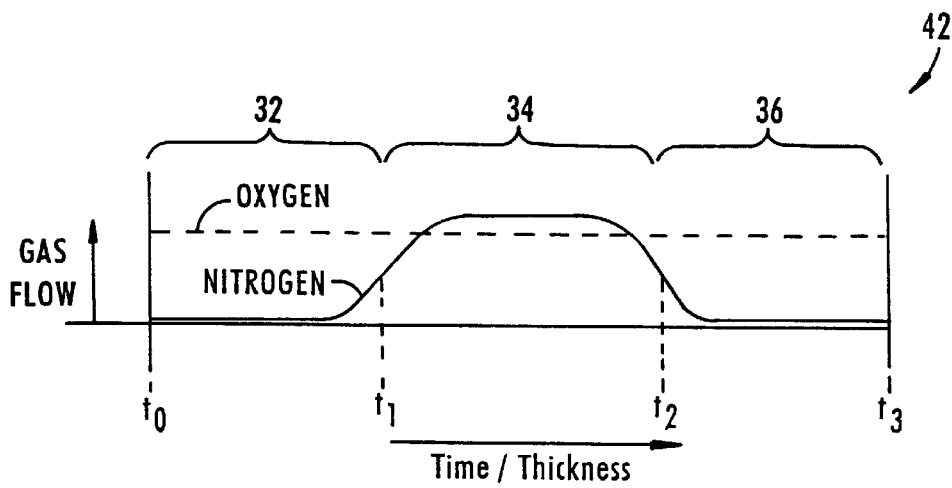
FIG. 6 is a graph that depicts the amount of oxygen and nitrogen gas flow employed during the formation of the single interpoly dielectric layer, for example, as depicted in FIGS. 3 and 4a–c, in accordance with certain other embodiments of the present -invention, wherein the flow of oxygen is substantially unchanged and the flow of nitrogen is gradually increased and decreased as a function of time
Figure 7:
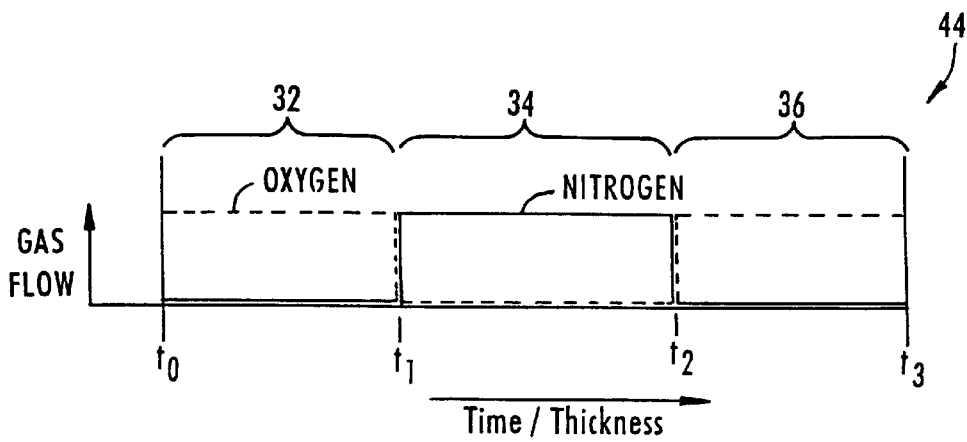
FIG. 7 is a graph that depicts the amount of oxygen and nitrogen gas flow employed during the formation of the graded interpoly dielectric layer, for example, as depicted in FIGS. 3 and 4a–c, in accordance with still other embodiments of the present invention, wherein the flow of oxygen is essentially stopped for a period of time during which the flow of nitrogen is nearly instantaneously started and later stopped.

FIGS. 6 and 7 depict exemplary alternative processes, 42 and 44 respectively, which are based on process 40 as depicted in FIG. 5 and described above. As shown in FIG. 6, the flow rate of oxygen source gas is maintained, substantially unchanged, at the first rate from about time $t_0$ to about time $t_3$. Beginning at or about time $t_1$, however, the flow rate. of nitrogen source gas is gradually increased to a higher second level. In reverse fashion, at or about time $t_2$ the flow rate of nitrogen source gas is gradually reduced to about the level it was between time $t_0$ and time $t_1$ (which may be completely shut-off). Consequently, the resulting amount of nitrogen within nitrogen-rich region 34 is significantly greater than the amount of oxygen within the same region. As with the graph depicted in FIG. 5, the graph depicted in FIG. 6 also illustrates that the flow rates can vary as a function of time.

FIG. 7 depicts process 44, wherein the flow rates of the oxygen and nitrogen source gases are nearly instantaneously started and/or stopped at various time to create a more step-like function between regions 32 and 34 and between regions 34 and 36, as needed. Thus, for example, at or about time $t_0$ the flow rate of oxygen source gas is at about a first rate and the flow rate of nitrogen source gas is substantially zero (i.e., shut-off). At or about time $t_1$, and until time $t_2$, the flow rate of nitrogen source gas is at about a second rate and the flow rate of oxygen source gas is substantially zero. At or about time $t_2$, and until time $t_3$ the flow rate of oxygen source gas is again at about the first rate and the flow rate of nitrogen source gas is substantially zero.

By way of example, in accordance with certain preferred embodiments of the present invention, graded interpoly dielectric layer 30 can be formed in a furnace, such as the Alpha 8 available from TEL of Japan. Graded interpoly dielectric layer 30 is between about 40 Angstroms and about 200 Angstroms thick.

Nitrogen-rich region 34 is substantially formed by supplying between about 10% and about 50% of dichlorosilane, and between about 50% and about 90% of $NH_3$.

By maintaining the wafer in a single tool during the interpoly dielectric formation process, the present invention reduces manufacturing costs and time. Other advantages include charge retention and reliability. Also, the wafer does not get exposed to air, thereby reducing contamination. Further, there is no interface, and therefore no charge traps. Additionally, changing the source gases to change the concentrations of oxygen and nitrogen during the formation of the interpoly dielectric layer also allows for a thinner layer to be manufactured than with prior art methods of forming interpoly dielectric layers.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A semiconductor device comprising:
   a floating gate structure;
   a control gate structure; and
   a single continuous non-laminated dielectric layer located between the floating gate structure and the control gate structure, the single continuous non-laminated dielectric layer being between about 40 Angstroms to about 300 Angstroms thick and including silicon having a first oxygen-rich region, a nitrogen-rich region, and a second oxygen-rich region, wherein
   the first oxygen-rich region is between about 1 Angstrom to about 200 Angstroms thick and is in direct physical contact with at least a portion of the floating gate structure,
   the nitrogen-rich region the nitrogen-rich region is between about 10 Angstroms and about 300 Angstroms thick, has a concentration of nitrogen that is substantially constant throughout the entire thickness of the nitrogen-rich region and is located between the first and second oxygen-rich regions, and
   the second oxygen-rich region is between about 1 Angstrom to about 100 Angstroms thick and is in direct physical contact with at least a portion of the control gate structure.

2. The semiconductor device as recited in claim 1, wherein the nitrogen-rich region further comprises oxygen.

3. The semiconductor device as recited in claim 1, wherein the first oxygen-rich region further comprises nitrogen and a percentage of nitrogen within the first oxygen-rich region is significantly less than a percentage of oxygen near a top surface of the floating gate structure.

4. The semiconductor device as recited in claim 1, wherein the second oxygen-rich region further comprises nitrogen and a percentage of nitrogen within the second oxygen-rich region is significantly less than a percentage of oxygen near a lower surface of the control gate structure.

* * * * *